(12) United States Patent
Kim et al.

(10) Patent No.: US 12,453,268 B2
(45) Date of Patent: Oct. 21, 2025

(54) DISPLAY DEVICE AND METHOD OF MANUFACTURING SAME

(71) Applicant: SAMSUNG DISPLAY CO., LTD., Yongin-si (KR)

(72) Inventors: Youngdo Kim, Cheonan-si (KR); Hoonsik Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/490,731

(22) Filed: Oct. 19, 2023

(65) Prior Publication Data
US 2024/0074278 A1 Feb. 29, 2024

Related U.S. Application Data

(60) Continuation of application No. 17/862,334, filed on Jul. 11, 2022, now Pat. No. 11,800,774, which is a
(Continued)

(30) Foreign Application Priority Data

Apr. 13, 2015 (KR) ........................ 10-2015-0051987

(51) Int. Cl.
*H10K 59/38* (2023.01)
*H10K 50/86* (2023.01)
(Continued)

(52) U.S. Cl.
CPC ............. *H10K 59/38* (2023.02); *H10K 50/86* (2023.02); *H10K 50/865* (2023.02);
(Continued)

(58) Field of Classification Search
CPC ...... H10K 59/38; H10K 50/86; H10K 50/865; H10K 71/00; H10K 50/844; H10K 59/35; H10K 2102/311
See application file for complete search history.

(56) References Cited

U.S. PATENT DOCUMENTS 8,664,021 B2    3/2014   Kim et al.
8,866,170 B2   10/2014   Moon et al.
(Continued)

FOREIGN PATENT DOCUMENTS

JP       2006-30650 A      2/2006
KR    10-2002-0064302      8/2002
(Continued)

OTHER PUBLICATIONS

Abstract for Korean Pub. No. 10-2002-0087206 A, dated Nov. 22, 2002, for corresponding KR 10-0755750 B1, 1 page.
(Continued)

*Primary Examiner* — Kevin Quarterman
(74) *Attorney, Agent, or Firm* — Womble Bond Dickinson (US) LLP

(57) ABSTRACT

A method of manufacturing a display device includes providing a display substrate divided into a plurality of emission regions, and a non-emission region adjacent the emission regions; forming a black matrix on the display substrate, the black matrix corresponding to the non-emission region; and forming a plurality of color patterns on the display substrate through a solution process, the plurality of color patterns corresponding to the emission regions.

11 Claims, 12 Drawing Sheets

Related U.S. Application Data continuation of application No. 17/061,430, filed on Oct. 1, 2020, now Pat. No. 11,387,287, which is a continuation of application No. 16/403,376, filed on May 3, 2019, now Pat. No. 10,811,467, which is a division of application No. 15/041,862, filed on Feb. 11, 2016, now Pat. No. 10,325,962.

(51) Int. Cl.
*H10K 59/80* (2023.01)
*H10K 71/00* (2023.01)
*H10K 50/844* (2023.01)
*H10K 59/35* (2023.01)
*H10K 102/00* (2023.01)

(52) U.S. Cl.
CPC ....... *H10K 59/873* (2023.02); *H10K 59/8792* (2023.02); *H10K 71/00* (2023.02); *H10K 50/844* (2023.02); *H10K 59/35* (2023.02); *H10K 2102/311* (2023.02)

(56) References Cited

U.S. PATENT DOCUMENTS

| | | | |
|---|---|---|---|
| 11,800,774 B2 * | 10/2023 | Kim | H10K 59/38 |
| 2005/0157157 A1 | 7/2005 | Tsukamoto et al. | |
| 2007/0200492 A1 | 8/2007 | Cok et al. | |
| 2011/0128643 A1 | 6/2011 | Nakamata | |
| 2012/0032151 A1 | 2/2012 | Hama et al. | |
| 2015/0123085 A1 * | 5/2015 | Kim | H10K 50/86 257/40 |

FOREIGN PATENT DOCUMENTS

| | | |
|---|---|---|
| KR | 10-0495740 B1 | 6/2005 |
| KR | 10-0638956 B1 | 10/2006 |
| KR | 10-0755750 B1 | 9/2007 |
| KR | 10-2009-0023152 A | 3/2009 |
| KR | 10-2010-0105625 | 9/2010 |
| KR | 10-2010-0108535 | 10/2010 |
| KR | 10-2012-0053340 A | 5/2012 |
| KR | 10-2012-0089950 | 8/2012 |
| KR | 10-1284153 B1 | 7/2013 |

OTHER PUBLICATIONS

Abstract for Korean Pub. No. 10-2004-0014304 A, dated Feb. 14, 2004, for corresponding KR 10-0638956 B1, 2 pages.

Abstract for Korean Pub. No. 10-2012-0081726 A, dated Jul. 20, 2012, for corresponding KR 10-1284153 B1, 1 page.

Kim et al., "The synthesis and application of thermally stable dyes for ink-jet printed LCD color filters," Dyes and Pigments, 2009, Vo. 81, pp. 45-52.

Sabnis, "Color filter technology for liquid crystal displays," Displays vol. 20, 1999, pp. 119-129.

* cited by examiner

DISPLAY DEVICE AND METHOD OF MANUFACTURING SAME

CROSS-REFERENCE TO RELATED APPLICATIONS

This application is a continuation of U.S. patent application Ser. No. 17/862,334, filed Jul. 11, 2022, which is a continuation of U.S. patent application Ser. No. 17/061,430, filed Oct. 1, 2020, U.S. Pat. No. 11,387,287, which is a continuation of U.S. patent application Ser. No. 16/403,376, filed May 3, 2019, now U.S. Pat. No. 10,811,467, which is a divisional of U.S. patent application Ser. No. 15/041,862, filed Feb. 11, 2016, now U.S. Pat. No. 10,325,962, which claims priority to and the benefit of Korean Patent Application No. 10-2015-0051987, filed Apr. 13, 2015, the entire content of all of which is incorporated herein by reference.

BACKGROUND

The present disclosure herein relates to a display device capable of improved display quality and to a method of manufacturing the same.

A display device may include a display substrate and a variety of functional films. The functional films reduce reflectance of external light from a display device to enhance outside visibility of the display device.

As the number of the functional films increases with respect to a same display substrate, the display device becomes thicker. As the number of the functional films increases, outside visibility may be enhanced, although flexibility of the display device may be reduced.

SUMMARY

The present disclosure provides a flexible display device with enhanced visibility.

The present disclosure also provides a method of manufacturing a display device, the method with a reduced process cost and a reduced process time.

A method of manufacturing a display device according to an embodiment of the present invention includes providing a display substrate divided into a plurality of emission regions, and a non-emission region adjacent the emission regions; forming a black matrix on the display substrate, the black matrix corresponding to the non-emission region; and forming a plurality of color patterns on the display substrate through a solution process, the plurality of color patterns corresponding to the emission regions.

The solution process may include an ink-jet process.

The forming the black matrix may include performing a photolithography process.

The forming the black matrix may include coating the display substrate with a photosensitive material to form a photosensitive layer; selectively irradiating the photosensitive layer by using a mask; baking the photosensitive layer; and developing the photosensitive layer.

The forming the black matrix may further include providing plasma on the display substrate to surface-treat the black matrix.

The forming the color patterns may include providing a color solution to respective ones of the emission regions to form a plurality of color solution layers; and drying the color solution layers.

The method may further include drying the color solution layers using heat.

A temperature of the heat may be about 150 degrees (° C.) or below.

Each of the color patterns may be thinner than a respective one of the color solution layers, and may be thinner than an adjacent region of the black matrix. Adjacent ones of the color patterns may have different colors.

The display substrate may include organic light emitting devices at the emission regions, respectively; and an encapsulation layer sealing the organic light emitting devices and including an inorganic material deposited on the organic light emitting devices.

The black matrix and the color patterns may be directly on the encapsulation layer.

A display device according to an embodiment of the present invention may include a display substrate divided into a plurality of emission regions, and a non-emission region adjacent the plurality of emission regions; a black matrix on the display substrate and corresponding to the non-emission region; and a color filter layer at a same layer as the black matrix, and including color patterns corresponding to the emission regions, respectively, wherein each of the color patterns is thinner than a respective adjacent portion of the black matrix.

The display substrate may include a base substrate; organic light emitting devices on the base substrate and corresponding to the emission regions; and a thin film encapsulation layer on the base substrate and sealing the organic light emitting devices, and wherein the color filter layer contacts the thin film encapsulation layer.

A range of a thickness of the thin film encapsulation layer may be from about 1 μm to about 10 μm.

The display device may further include a protective layer having a flat surface on the color filter layer.

BRIEF DESCRIPTION OF THE FIGURES

The accompanying drawings are included to provide a further understanding of embodiments of the present invention, and are incorporated in and constitute a part of this specification. The drawings illustrate exemplary embodiments of the present invention and, together with the description, serve to explain aspects of the present invention. In the drawings.

DETAILED DESCRIPTION

Figure 1:
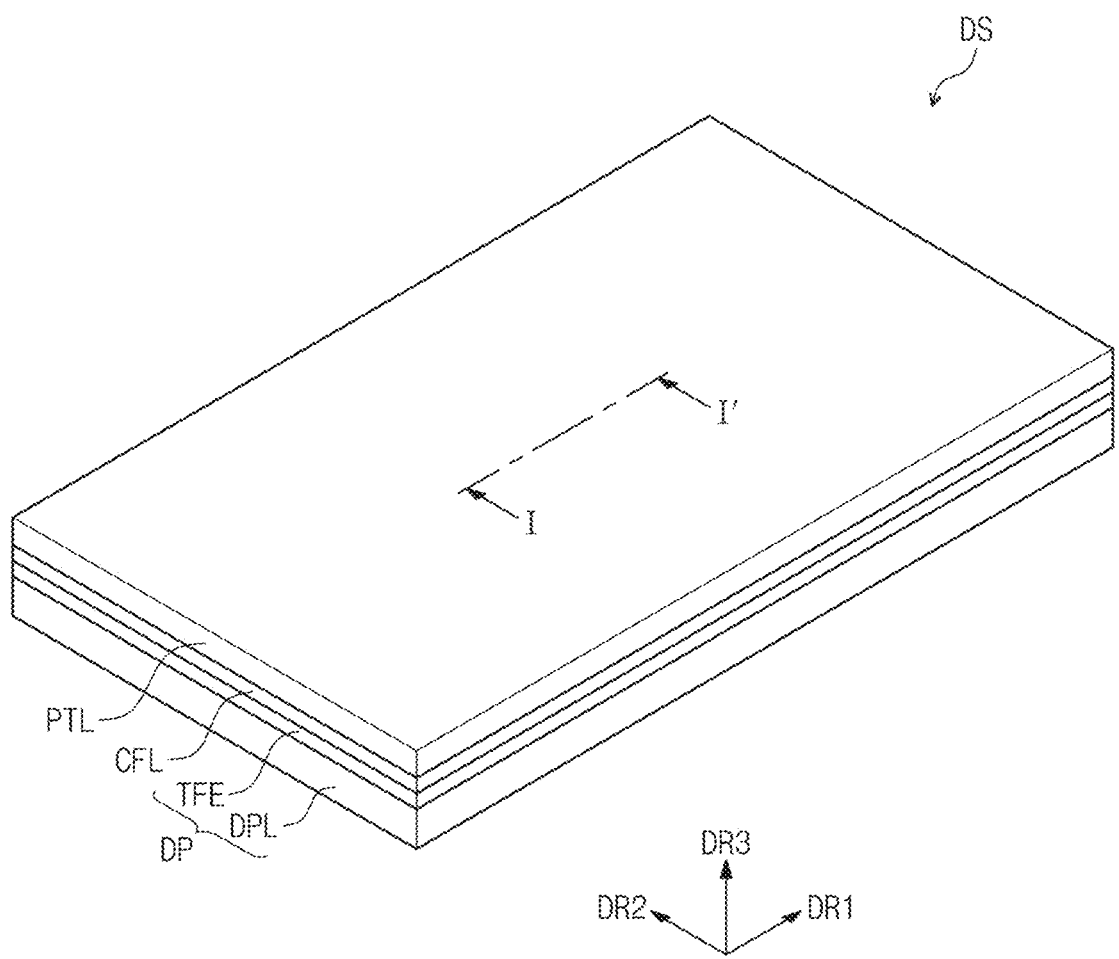
FIG. 1 illustrates a perspective view of a display device according to an embodiment of the present invention.

Hereinafter, embodiments of the present invention will be described in detail with reference to drawings.

It will be understood that, although the terms "first", "second", "third", etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer, or section discussed below could be termed a second element, component, region, layer, or section, without departing from the spirit and scope of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it will also be understood that when one element, component, region, layer and/or section is referred to as being "between" two elements, components, regions, layers, and/or sections, it can be the only element, component, region, layer and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent" another element or layer, it can be "directly on," "directly connected to," "directly coupled to," "directly connected with," "directly coupled with," or "directly adjacent" the other element or layer, or one or more intervening elements or layers may be present. Further "connection," "connected," etc. may also refer to "electrical connection," "electrically connect," etc. depending on the context in which they are used as those skilled in the art would appreciate. When an element or layer is referred to as being "directly on," "directly connected to," "directly coupled to," "directly connected with," "directly coupled with," or "immediately adjacent" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Figure 2:
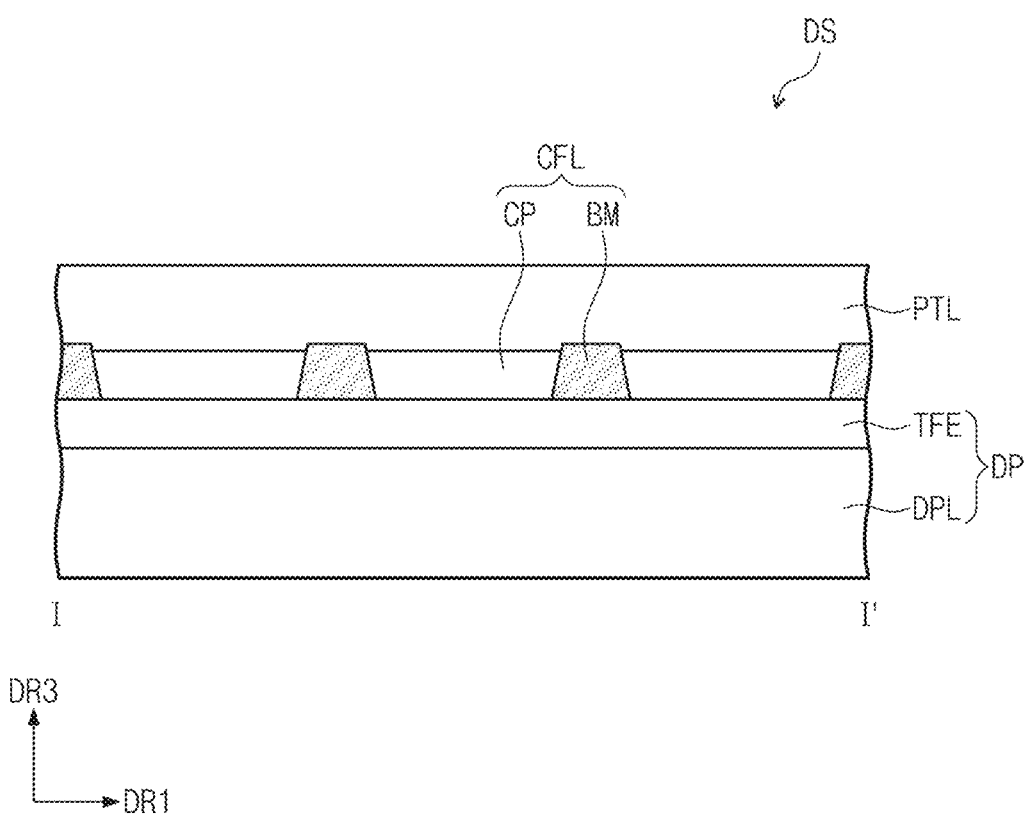
FIG. 2 illustrates a cross-sectional view taken along the line I-I' in FIG. 1.
Figure 3:
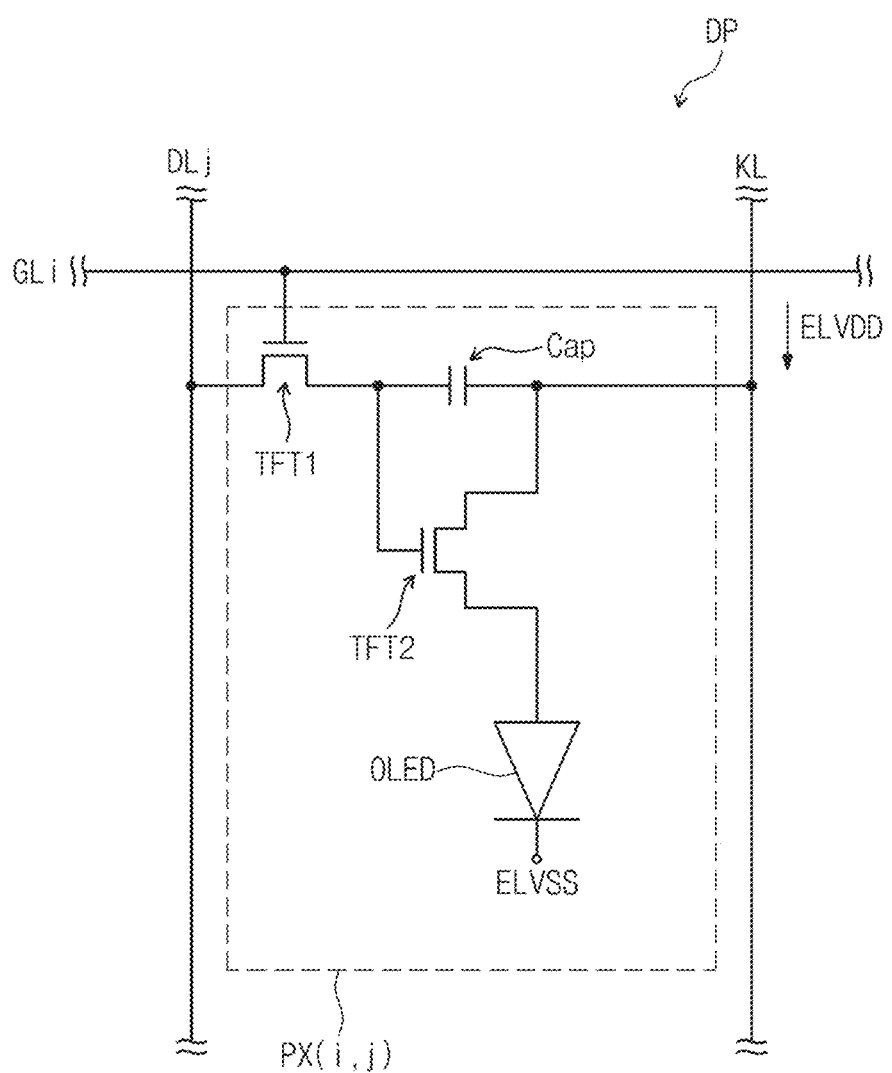
FIG. 3 illustrates an equivalent circuit diagram of a portion of a display substrate according to an embodiment of the present invention.

FIG. 1 illustrates a perspective view of a display device according to an embodiment of the present invention, FIG. 2 illustrates a cross-sectional view taken along the line I-I' in FIG. 1, and FIG. 3 illustrates an equivalent circuit diagram of a portion of a display substrate according to an embodiment of the present invention. Hereinafter, a display device DS will be described with reference to FIGS. 1 to 3.

The display device DS has a planar shape defined by a first direction DR1 and a second direction DR2 crossing the first direction DR1. The display device DS includes a display substrate DP, a color filter layer CFL, and a protective layer PTL that are sequentially stacked in an upward direction DR3 (hereinafter, referred to as a third direction DR3).

The display substrate DP is configured to display an image according to an electrical signal. In the present embodiment, the display substrate DP includes a display surface for displaying an image towards the third direction DR3.

The display substrate DP may be one or more of a variety of display panels. For example, a liquid crystal display panel, an organic light emitting display panel, an electrophoretic display panel, or an electrowetting display panel may be applied to the display substrate DP.

A flexible display panel, which is flexible and easily manufactured in small size, may be applied to the display substrate DP according to embodiments of the present invention. Hereinafter, the display substrate DP of the present embodiment is an organic light emitting display panel, but the present invention is not limited thereto.

The display substrate DP includes a display layer DPL and a thin film encapsulation layer TFE. The display layer DPL includes a plurality of pixels that are configured to respectively receive an electrical signal to generate an image.

FIG. 3 exemplarily illustrates one pixel PX(i,j) among the plurality of pixels that is connected to an i-th gate line GLi and to a j-th data line DLj. Each of the plurality of pixels may have a structure that is the same or substantially the same as the illustrated pixel PX(i,j). However, this illustration is only exemplary, and the configuration and arrangement of the PX(i,j) may be changed.

Referring to FIG. 3, the pixel PX(i,j) is configured to receive a gate signal from the i-th gate line GLi, and to receive a data signal from the j-th data line DLj. In addition, the PX(i,j) is configured to receive a first power supply voltage ELVDD from a power line KL. The pixel PX(i,j) includes a first thin film transistor TFT1, a second thin film transistor TFT2, a capacitor Cap, and an organic light emitting device OLED.

The first thin film transistor TFT1 is configured to output a data signal applied to the j-th data line DLj in response to the gate signal applied to the i-th gate line GLi. The capacitor Cap is configured to be charged with a voltage corresponding to the data signal received from the first thin film transistor TFT1.

The second thin film transistor TFT2 is connected to the organic light emitting device OLED, and is configured to control a drive current flowing in the organic light emitting device OLED corresponding to a charge amount stored in the capacitor Cap.

The organic light emitting device OLED includes a first electrode connected to the second thin film transistor TFT2, and a second electrode configured to receive the second power supply voltage ELVSS. In the present embodiment, the second power supply voltage ELVSS has a lower voltage level than the first power supply voltage ELVDD.

In addition, the organic light emitting device OLED at least includes an organic emission layer between the first and second electrodes. The organic light emitting device OLED is configured to emit light during a turn-on period of the second thin film transistor TFT2.

The thin film encapsulation layer TFE seals a plurality of pixels. The thin film encapsulation layer TFE may include an inorganic film, or may have a structure in which an inorganic film and an organic film are alternately stacked. The thin film encapsulation layer TFE generally has a transparent characteristic, so that an image may be viewed from outside.

The color filter layer CFL includes a black matrix BM and color patterns CP. The black matrix BM and the color patterns CP may be located at a same layer. In the present embodiment, the black matrix BM and the color patterns CP are directly on the thin film encapsulation layer TFE to be in contact with an upper surface of the thin film encapsulation layer TFE.

The black matrix BM may be formed of a light-shielding material, and may absorb light incident on the black matrix BM. Accordingly, the black matrix BM may generally have a color of a black series (e.g., a relatively dark color).

The color patterns CP have at least two different colors. In the present embodiment, the color patterns CP include a first color pattern CP-ft a second color pattern CP-G, and a third color pattern CP-B respectively having different colors from each other (see FIG. 5).

Adjacent ones of the color patterns CP may have colors different from each other. In the present embodiment, the first, second, and third color patterns CP-ft CP-G, and CP-B, which have different colors from each other, are sequentially arranged along the first direction DR1.

The present illustration is only exemplary, and the color patterns CP may have four or more colors in other embodiments of the present invention. Further, adjacent ones of the color patterns CP may have the same or substantially the same color as each other. The color filter layer CFL according to the present embodiment may be embodied in many different forms, and the present invention should not be construed as being limited to the embodiments set forth herein.

The protective layer PTL is located on the color filter layer CFL to protect the color filter layer CFL. The protective layer PTL provides a flat surface on an upper surface of the display device DS as defined towards the third direction D3. The flat surface corresponds to a whole surface of the display device DS. This illustration is only exemplary, and the protective layer PTL may be omitted in a display device DS according to other embodiments of the present invention.

Figure 4A:
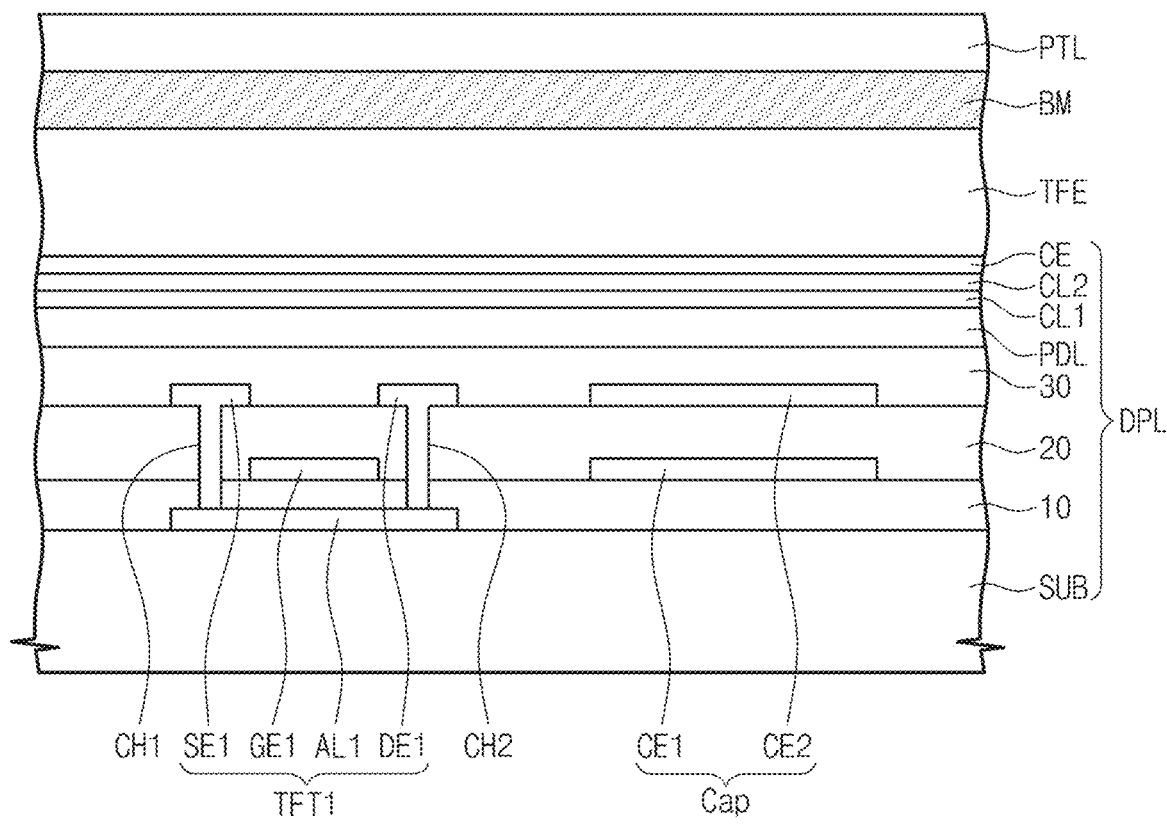
FIGS. 4A to 4B are cross-sectional views respectively illustrating portions of a display device according to an embodiment of the present invention.
Figure 4B:
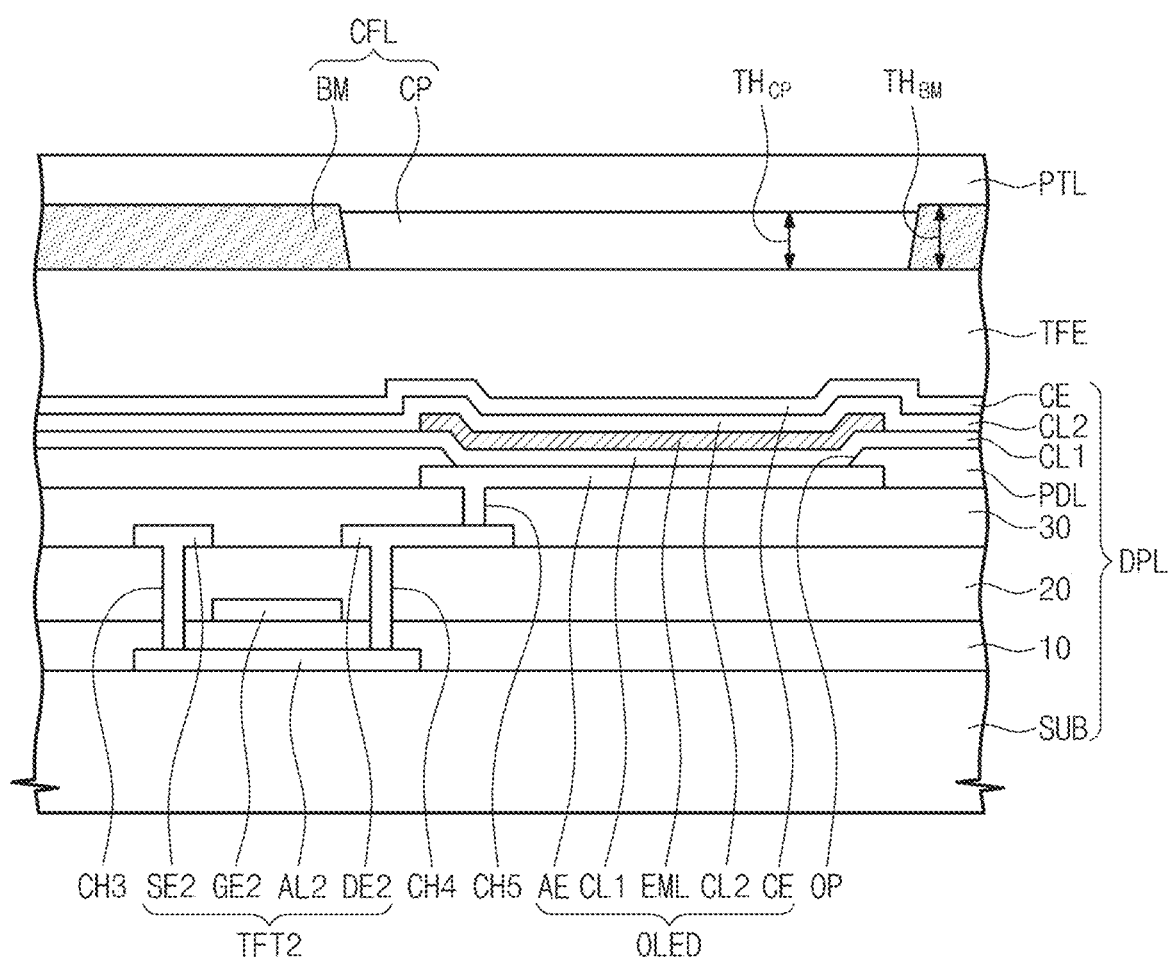
Figure 5:
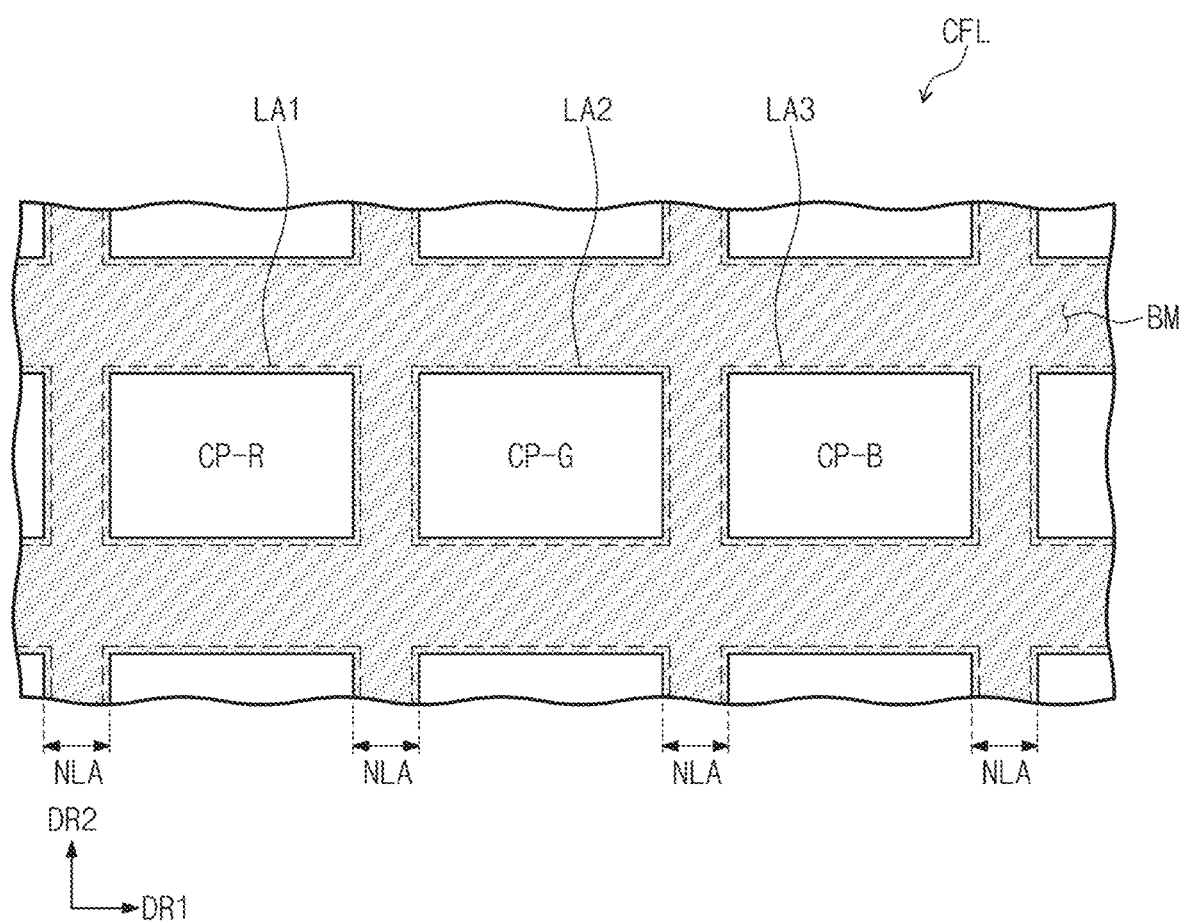
FIG. 5 illustrates a plan view of a portion of a color filter layer according to an embodiment of the present invention.

FIGS. 4A and 4B are cross-sectional views respectively illustrating portions of a display device according to an embodiment of the present invention, and FIG. 5 illustrates a plan view of a portion of a color filter layer according to an embodiment of the present invention.

FIG. 4A illustrates a cross-sectional view of a region including the first thin film transistor TFT1 and the capacitor Cap illustrated in FIG. 3, and FIG. 4B illustrates a cross-sectional view of a region including the second thin film transistor TFT2 and the organic light emitting device OLED illustrated in FIG. 3.

Hereinafter, a layer structure of a display device DS according to an embodiment of the present invention will be described in detail with reference to FIGS. 4A to 5. Components that are the same or substantially similar to the components illustrated in FIGS. 1 to 3 are given the same reference numeral, and repeated descriptions thereof may be omitted.

Referring to FIGS. 4A and 4B, the display layer DPL includes a base layer SUB, a first thin film transistor TFT1, a second thin film transistor TFT2, a capacitor Cap, and an organic light emitting device OLED. The base layer SUB may include a glass substrate, a metal substrate, and/or a flexible plastic substrate.

A first semiconductor pattern AL1 of the first thin film transistor TFT1, a second semiconductor pattern AL2 of the second thin film transistor TFT2, and a first insulating layer 10 are located on the base layer SUB. The first insulating layer 10 covers the first and second semiconductor patterns AL1 and AL2. A first electrode CE1 of the capacitor Cap may be located on the first insulating layer 10.

A control electrode GE1 (hereinafter, referred to as a first control electrode GE1) of the first thin film transistor TFT1, a control electrode GE2 (hereinafter, referred to as a second control electrode GE2) of the second thin film transistor TFT2, and a second insulating layer 20 are located on the first insulating layer 10. The second insulating layer 20 covers the first and second control electrodes GE1 and GE2.

Each of the first and second insulating layers 10 and 20 includes an organic film and/or an inorganic film, and may include a plurality of thin films.

An input electrode SE1 (hereinafter, referred to as a first input electrode SE1) and an output electrode DE1 (hereinafter, referred to as a first output electrode DE1) of the first thin film transistor TFT1, an input electrode SE2 and an output electrode DE2 (hereinafter, respectively referred to as second input electrode SE2 and as second output electrode DE2) of the second thin film transistor TFT2, and a third insulating layer 20 are located on the second insulating layer 20.

A second electrode CE2 of the capacitor Cap may be located on the second insulating layer 20. The third insulating layer 30 covers the first input electrode SE1, the first output electrode DE1, the second input electrode SE2, the second output electrode DE2, and the second electrode CE2.

The first input electrode SE1 is connected to the first semiconductor pattern AL1 through a first through hole CH1 penetrating the second insulating layer 20, and the first output electrode DE1 is connected to the first semiconductor pattern AL1 through a second through hole CH2 penetrating the second insulating layer 20. In the same or similar manner, the second input electrode SE2 is connected to the second semiconductor pattern AL2 through a third through hole CH3 penetrating the second insulating layer 20, and the second output electrode DE2 is connected to the second semiconductor pattern AL2 through a fourth through hole CH4 penetrating the second insulating layer 20.

The organic light emitting device OLED and a pixel defining layer PDL are located on the third insulating film 30. The pixel defining layer PDL exposes a region of the organic light emitting device OLED on the third insulating film 30. The pixel defining layer PDL substantially defines an emission region of the OLED.

The organic light emitting device OELD includes an anode electrode AE, an emission pattern EML, a cathode electrode CE, a hole transport region CL1 (or, first common layer) between the anode electrode AE and the emission pattern EML, and an electron transport region CL2 (or, a second common layer) between the emission pattern EML and the cathode electrode CE.

The anode electrode AE is located on the third insulating layer 30. A plurality of anode electrodes AE is provided at respective emission regions and corresponding to respective pixels. The pixel defining layer PDL partially overlaps the anode electrode AE to expose at least some of the anode electrode AE. The anode electrode AE is connected to the second output electrode DE2 thorough a fifth through hole CH5 penetrating the third insulating layer 30.

The hole transport region CL1 is located on the anode electrode AE to cover the anode electrode AE and the pixel defining layer PDL, and may include at least one of a hole injection layer, a hole transport layer, and/or a single layer having both a hole injection function and a hole transport function.

The emission layer EML is located on the hole transport region CL1. A plurality of emission layers EML is provided to respectively overlap the emission regions. The emission pattern EML may include a fluorescent material or a phosphorescent material, and may generate a light having one color, or may generate a light in which at least two colors are mixed.

The electron transport region CL2 is located on the emission pattern EML to cover the emission pattern EML and the hole transport region CL1. The electron transport region CL2 may include at least any one of an electron transport material and an electron injection material. The electron transport region CL2 may be an electron transport layer including an electron transport material, or may be a single electron injection/transport layer including an electron transport material and an electron injection material.

The cathode electrode CE is located on the electron transport region CL2 to face the anode electrode AE, and may be formed of a material having a low work function to facilitate electron injection.

The cathode electrode CE and the anode electrode AE may be formed of different materials according to an emission type. For example, when the display device according to an embodiment of the present invention is a top emission type, the cathode electrode CE may be a transmissive electrode, and the anode AE may be a reflective electrode. Alternatively, for example, when the display device according to an embodiment of the present invention is a bottom emission type, the cathode electrode CE may be a reflective electrode, and the anode AE may be a transmissive electrode. The display device DS according to embodiments of the present invention may include an organic light emitting device of various suitable structures, and the present invention should not be limited to any one of the embodiments set forth herein.

The cathode electrode CE is located on/below the thin film encapsulation layer TFE, which covers a front surface of the cathode electrode CE to seal the organic light emitting device OLED.

The thin film encapsulation layer TFE may have a thickness ranging from about 1 µm to about 10 µm. The display substrate DP includes the thin film encapsulation layer TFE, thus being able to achieve a thin display device. The thin film encapsulation layer TFE may include a plurality of inorganic films. Each of the inorganic films may include at least any one of a silicon nitride or a silicon oxide. In addition, the thin film encapsulation layer TFE may further include another functional layer between the inorganic films.

Referring to FIG. 5, the black matrix BM overlaps a non-emission region NLA, and each of the color patterns CP overlap an emission region LA. The black matrix BM has a grid shape in a plane defined by the first direction DR1 and the second direction DR2.

A plurality of openings exposing each of a plurality of regions corresponding to emission regions LA are defined by the black matrix BM. The color patterns CP are filled in the plurality of openings.

The black matrix BM may include an organic material having a high light absorption rate, and may include, for example, a black pigment or a black dye.

The color patterns CP are respectively located at regions corresponding to the emission regions LA. Accordingly, the color patterns CP may be spaced from each other in a matrix shape.

The color patterns CP may have colors different from each other. Adjacent ones of the color patterns CP may have colors different from each other. For example, the first, second, and third color patterns CP-R, CP-G, and CP-B, which are sequentially arranged in the first direction DR1, may respectively have a red color, a green color, and a blue color.

Referring back to FIGS. 4A and 4B, the black matrix BM overlaps the first thin film transistor TFT1, the second thin film transistor TFT2, and the capacitor Cap, which are located at the non-emission region NLA. In addition, each of the color patterns CP may overlap the organic light emitting device OLED located at an emission region LA.

Thicknesses of one or all of the color patterns CP may be different from a thickness of the black matrix BM. For example, referring to FIG. 4B, the thickness $TH_{CP}$ of any one color pattern CP may be less than the thickness $TH_{BM}$ of the black matrix BM.

The color patterns CP according to an embodiment of the present invention is formed by a solution process. For example, moisture is removed while the color patterns CP are provided as a liquid and dried, and accordingly, each of the color patterns may be thinner than the black matrix BM. Details thereof will be described below.

Referring back to FIGS. 4A and 4B, the protective layer PTL is located on the color filter layer CFL to cover the color patterns CP and the black matrix BM. The protective layer PTL protects the color filter layer CFL, and provides a flat surface on the color filter layer CFL.

As described above, the color patterns CP have different thickness than the black matrix BM, thus potentially forming a slightly uneven top surface. The protective layer PTL improves an uneven surface formed by the color filter layer CFL. Accordingly, a user may visually recognize an image displayed on a uniform flat surface regardless of a potentially uneven surface of the color filter layer CFL.

Figure 6:
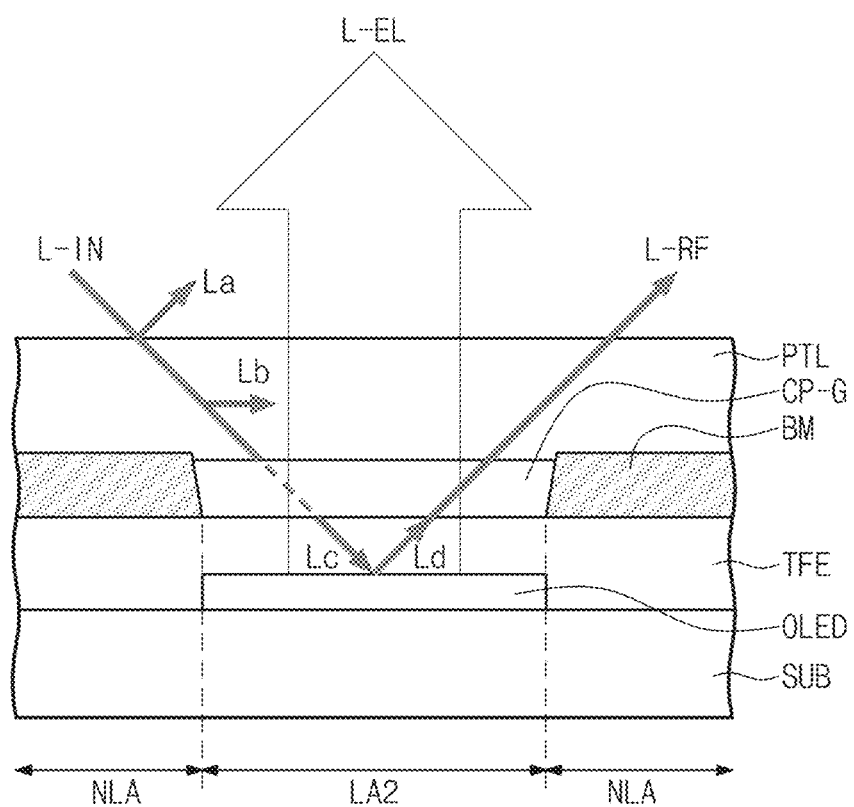
FIG. 6 illustrates a cross-sectional view of a portion of a display device according to an embodiment of the present invention.

FIG. 6 illustrates a cross-sectional view of a portion of a display device according to an embodiment of the present invention. In FIG. 6, for an easy description of an embodiment of the present invention, a display device DS in which some of the elements (or components) are omitted is illustrated based on one emission region LA2.

For example, an organic light emitting device OLED in FIG. 6 substantially corresponds to an organic emission layer EML (see FIG. 4B). The same or substantially the same elements (or components) as those illustrated in FIGS. 1 to 5 are given the same reference numerals, and a description thereof may be omitted.

FIG. 6 illustrates optical paths that may occur in a display device DS. As illustrated in FIG. 6, the display device DS is influenced by at least three lights.

An internal light L-EL is generated inside the display device DS to be discharged to outside the display device DS toward the third direction DR3. An external light L-IN is incident to the display device DS, and a reflected light L-RF component of the external light L-IN is reflected from the display device DS to be emitted.

The organic light emitting device OLED generates the internal light L-EL having a set or predetermined color to emit the generated internal light L-EL to outside. The color of the internal light L-EL generated by the organic light emitting device OLED may be substantially the same as a color of a color pattern overlapping the organic light emitting device OLED.

For example, the organic light emitting device OLED of the present example emits a light L-EL of green color, and the color pattern CP-G may have a green color that is substantially similar to the green color of the light L-EL. The internal light L-EL may be partially absorbed by the thin film encapsulation layer TFE, the color filter layer CFL, and the protective layer PTL when passing through the thin film encapsulation layer TFE, the color filter layer CFL, and the protective layer PTL.

The external light L-IN may be a visible light (e.g., sunlight). A first portion light La component of the external light L-IN may be reflected from a surface (e.g., an upper surface) of the protective layer PTL. Even when the external light L-IN enters the protective layer PTL without being reflected from the surface, a second portion light Lb component of the external light L-IN may be absorbed by the protective layer PTL.

A third portion light Lc component of the external light L-IN may pass through the color pattern CP-G to be incident on the organic light emitting device OLED. The third portion light Lc may be a component of the external light L-IN that passes through the color pattern CP-G.

Wavelengths of visible light may be generally classified into a red wavelength region ranging from about 550 nm to about 750 nm, a green wavelength region ranging from about 480 nm to about 550 nm, and a blue wavelength region ranging from about 350 nm to about 480 nm.

As described above, the color pattern CP-G of the present example has a green color, thus passing only light in the green wavelength region. Accordingly, the third portion light Lc component of the external light L-IN has a wavelength corresponding to the color green. In the organic light emitting device OLED, at least a portion of the third portion light Lc is reflected to form a fourth portion light Ld.

The fourth portion light Ld is discharged outside the display device DS through the thin film encapsulation layer TFE, the color pattern CP-G, and the protective layer PTL, and may be visually recognized as the reflected light L-RF. The fourth portion light Ld is a light immediately reflected from the organic light emitting device OLED, and the reflected light L-RF may be a light emitted outside through the thin film encapsulation layer TFE, the color pattern CP-G, and the protective layer PTL. It should be noted that the fourth portion light Ld may be partially absorbed or scattered by the thin film encapsulation layer TFE, the color pattern CP-G, and/or the protective layer PTL.

Accordingly, the reflected light L-RF may have a lower intensity than (e.g., may be a component of) the fourth portion light Ld. In addition, the reflected light L-RF may have a lower intensity than the external light L-In by about 15% or less. Accordingly, the display device according to an embodiment of the present invention further includes the color filter layer CFL, thus being able to obtain an effect of reducing or preventing reflection of external light L-IN.

An optical film, such as a polarizing film or a retardation film, may generally reduce light efficiency of a display device by refracting or reflecting the internal light L-EL. The display device according to an embodiment of the present invention may omit the optical film, and may include the color filter layer CFL to reduce external light reflectance, thus providing a display device DS with improved visibility.

The optical film is generally provided in the form of a film, thus generally increasing thickness of the display device. In addition, an adhesive layer may be used to apply the optical film to the display device. Therefore, the increased thickness of the display device may affect flexibility of the display device.

Conversely, the color filter layer CFL may be directly located on the display substrate DPL, and may be formed through a patterning process and the like, thus being able to be thinner than the optical film. According to an embodiment of the present invention, because the optical film may be omitted while a single color filter layer CFL is included, it is possible to reduce the thickness of the display device DS.

Generally, the thinner the display device is, the more flexible the display device becomes. Therefore, according to an embodiment of the present invention, it is possible to realize a thin display device that is foldable/bendable.

Figure 7:
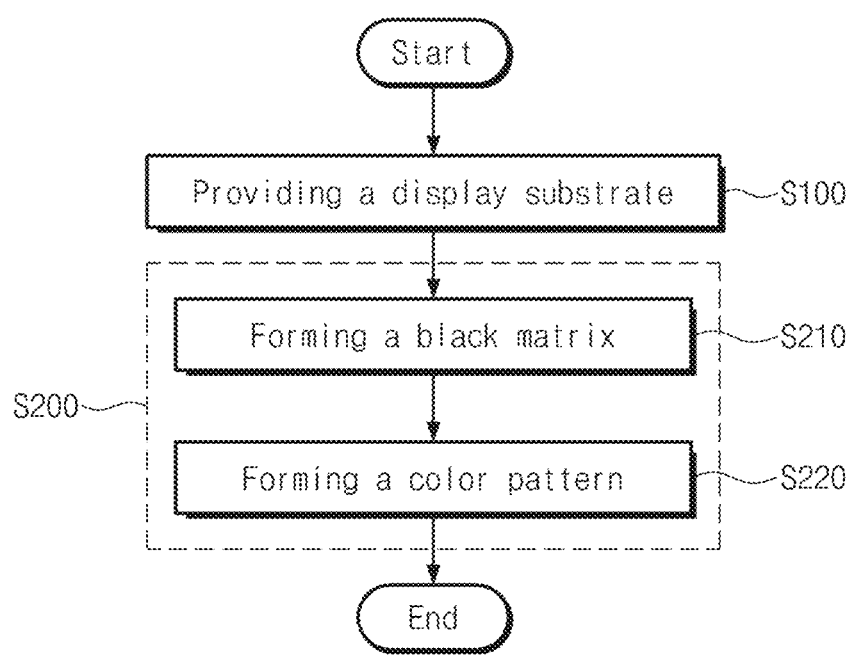
FIG. 7 illustrates a flow chart of a method of manufacturing a display device according to an embodiment of the present invention.

FIG. 7 illustrates a flow chart of a method of manufacturing a display device according to an embodiment of the present invention, and FIGS. 8A to 8H are cross-sectional views sequentially illustrating a method of manufacturing a display device according to an embodiment of the present invention. Hereinafter, a method of manufacturing a display device according to an embodiment of the present invention will be described with reference to FIGS. 7 to 8H.

Figure 8A:
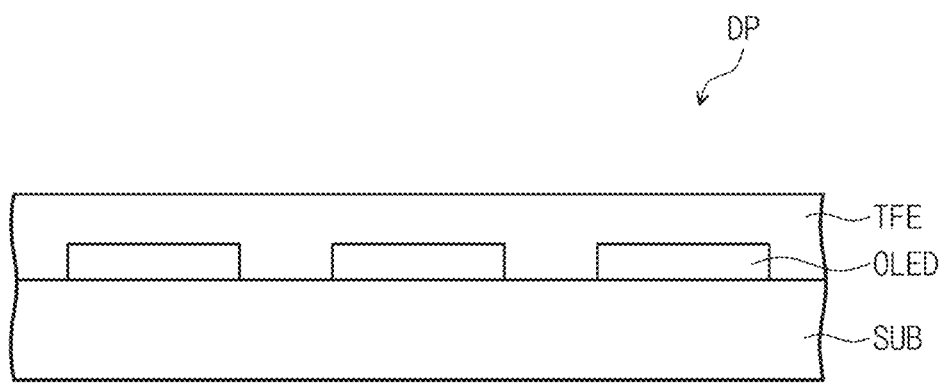
FIGS. 8A to 8H are cross-sectional views sequentially illustrating a method of manufacturing a display device according to an embodiment of the present invention.

As illustrated in FIGS. 7 and 8A, a method of manufacturing a display device includes providing a display substrate S100, and forming a color filter layer S200. For an easy description, the display substrate DP is illustrated to include only some of the possible configurations.

Figure 8B:
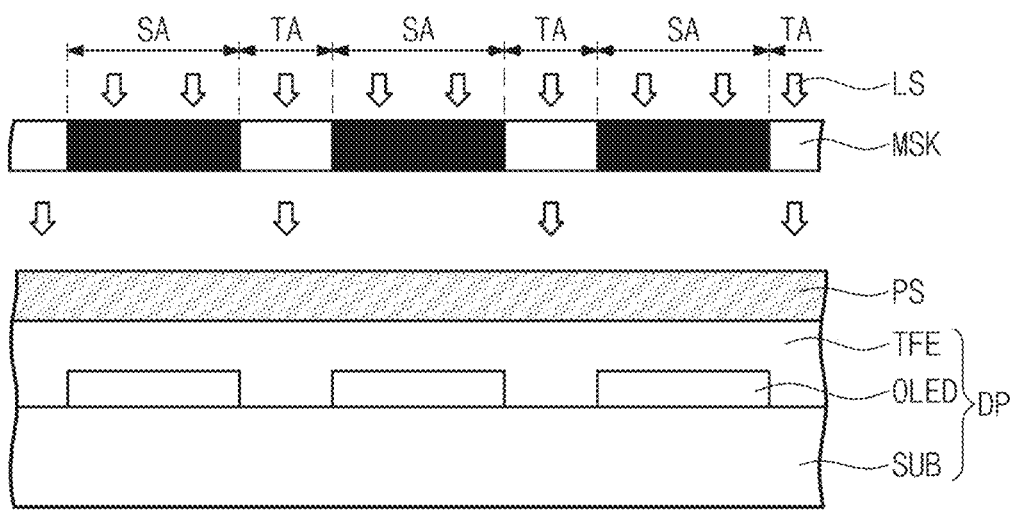
Figure 8C:
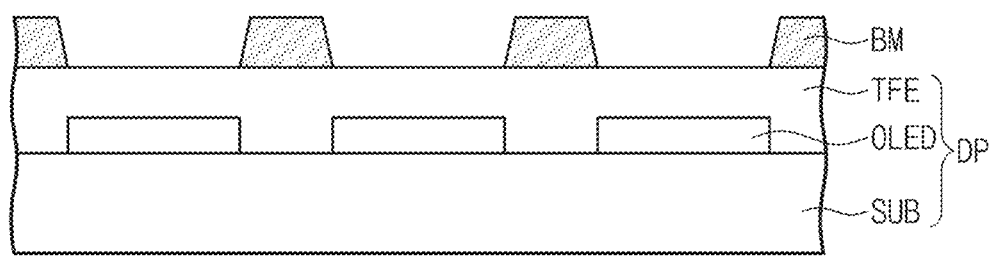

Referring to FIGS. 7, 8B, and 8C, a black matrix BM is formed on a display substrate DP (S210). The black matrix BM may be formed through various suitable processes, and may be directly formed on a thin film encapsulation layer TFE. In the present embodiment, the black matrix BM may be formed through a photolithography process. Therefore, pattern accuracy and reliability of the black matrix BM is improved, and thus, the black matrix BM may play a role as a barrier rib in a subsequent process.

First, a photosensitive film PS is formed by coating a photosensitive material on a thin film encapsulation layer TFE. A mask MSK provided with a plurality of transmission regions TA and a shielding region(s) SA is placed on or above the photosensitive film PS, and the photosensitive film PS is patterned to form a black matrix BM.

Light LS is selectively transmitted through the mask MSK (e.g., through the transmission regions TA), and is incident on the photosensitive layer PS. In this embodiment, the photosensitive film PS may be a positive type. Accordingly, regions corresponding to the transmission regions TA among the photosensitive film PS are cross-linked by the light LS. A region corresponding to the shielding region SA is removed through a developing process using a developing solution, and the cross-linked portion(s) remains to form the black matrix BM.

The above description is only exemplary, and the photosensitive film PS according to an embodiment of the present invention may be a negative type. That is, the black matrix BM may be formed through a mask having transmission regions that correspond to a shape of the black matrix, as opposed to transmission regions that correspond to the emission regions.

Figure 8D:
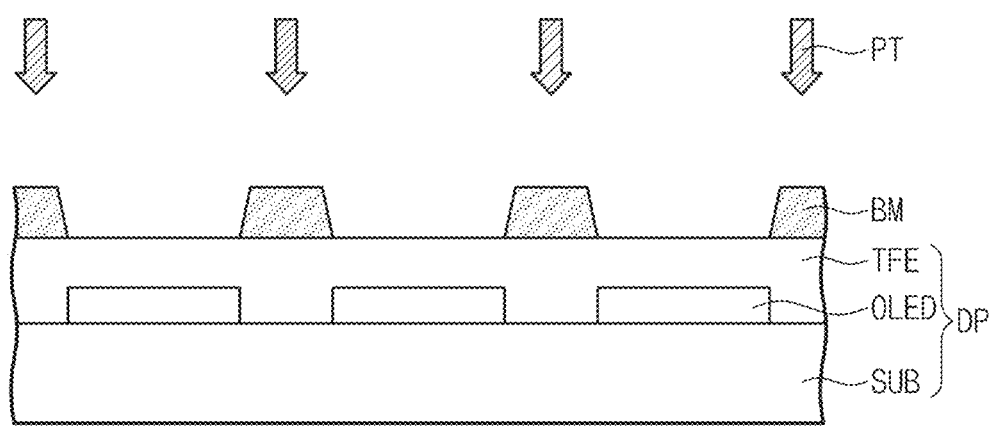

As illustrated in FIG. 8D, a method of manufacturing a display device according to an embodiment of the present invention may further include a plasma treatment process. The plasma treatment process may be performed on the black matrix BM to surface-treat the black matrix BM.

Accordingly, thermal stability of the black matrix BM is increased, so that a color solution may be stably confined in a color pattern forming process performed as a subsequent solution process. In addition, the color patterns may be stably formed by enhancing adhesion with the color solution. The above description is only exemplary, and in a method of manufacturing a display device according to an embodiment of present invention, the plasma treatment process may be omitted.

Referring to FIGS. 7, and 8E to 8H, a color pattern is formed on the display substrate (S220). The color pattern may be formed by various suitable processes in addition to a photolithography process. For example, the color patterns CP-R, CP-G, and CP-B may be formed by a solution process, such as a dropping process or an ink-jet process. Alternatively, the color patterns CP-ft CP-G, and CP-B may be formed by a staining method, a printing process, or an electric deposition method.

In the present embodiment, a process of forming the color patterns CP-ft CP-G, and CP-B through an ink-jet process will be described as an example. In the present embodiment, the color patterns CP-ft CP-G, and CP-B are directly formed on the thin film encapsulation layer TFE.

Figure 8E:
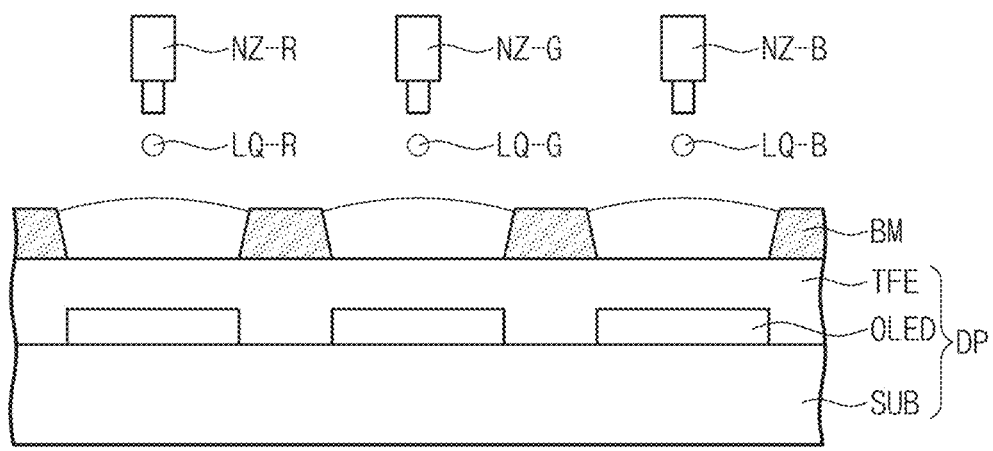

As illustrated in FIG. 8E, a color solution is provided to each of regions exposed by the black matrix BM. The black matrix BM effectively acts as a dam for confining the color solution to a respective area during the ink-jet process.

For example, a first nozzle NZ-R provides a first color solution LG-R to a first opening, a second nozzle NZ-G provides a second color solution LG-G to a second opening, and a third nozzle NZ-B provides a third color solution LG-B to a third opening.

In the present embodiment, the first to third color solutions LQ-R, LQ-G, and LQ-B are differently colored. Accordingly, the first to third nozzles LN-R, LN-G, and LN-B, which are distinguished from each other, are provided to respective regions exposed by the black matrix BM.

The above description is only exemplary, and color solutions having the same or substantially the same color may be provided to the display substrate DP according to an embodiment of the present invention, in which case a single nozzle may be used. Alternatively, in a method of manufacturing a display device according to an embodiment of the present invention, four or more nozzles may be provided, although the present invention is not limited to any one embodiment.

Figure 8F:
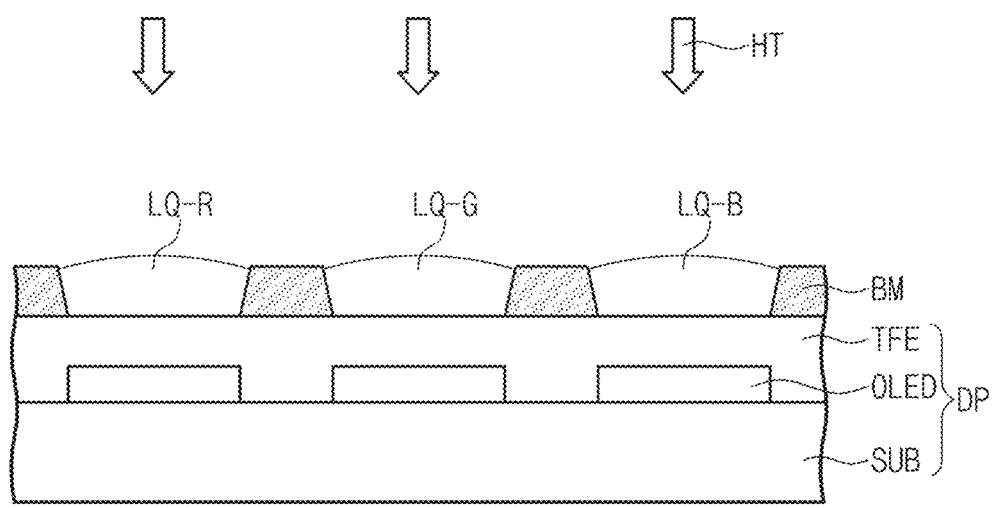
Figure 8G:
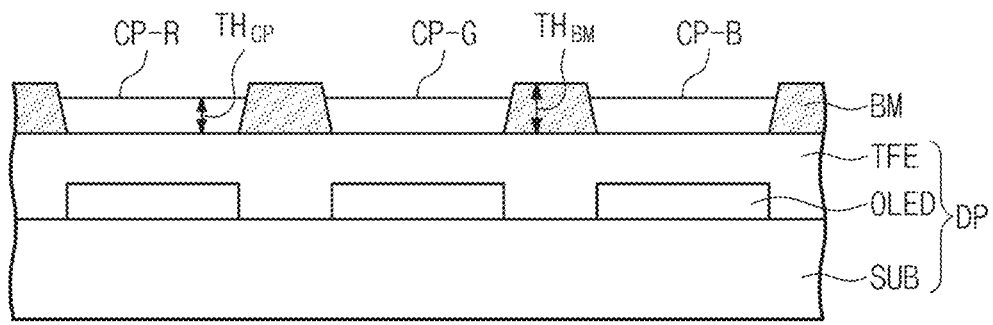

As illustrated in FIGS. 8F and 8G, a plurality of color solution layers LQ-R, LQ-G, and LQ-B, which respectively fill the openings formed in the black matrix BM, are dried to respectively form the color patterns CP-ft CP-G, and CP-B. In FIG. 8F, illustrated is a process of providing heat HT to the color solution layer to cure the color solution layer. The above description is only exemplary, and the drying process is not particularly limited.

The drying process may be performed at a temperature of about 150 degrees (° C.) or below. For example, the color patterns CP-ft CP-G, and CP-B according to an embodiment of the present invention may be formed by drying and curing the color solution layers LQ-R, LQ-G, and LQ-B with heat of about 100 degrees (° C.). Therefore, it is possible to prevent or reduce damage to the organic light emitting device OLED during the drying process, so that the process stability is improved.

As a plurality of color solution layers LQ-R, LQ-G, and LQ-B are cured, moisture and the like contained in the solution layer may be removed. Accordingly, a plurality of color solution layers LQ-R, LQ-G, and LQ-B may vary in thickness before and after curing. Each of the plurality of color solution layers LQ-R, LQ-G, and LQ-B may be thicker than each of the respectively corresponding color patterns CP-ft CP-G, and CP-B.

Furthermore, each of the thicknesses $TH_{CP}$ of the color patterns CP-ft CP-G, and CP-B may be thinner than the thickness $TH_{BM}$ of the black matrix BM that is adjacent the color patterns CP-ft CP-G, and CP-B. According to an embodiment of the present invention, because the black matrix BM and the color patterns CP-ft CP-G, and CP-B are formed by different processes, and because the color patterns CP-ft CP-G, and CP-B are formed by the ink-jet process, the black matrix GM and the color patterns CP-ft CP-G, and CP-B may have different thicknesses.

In the method of manufacturing a display device according to an embodiment of the present invention, the black matrix is formed through a photolithography process, and the color patterns are formed through a photolithography process and another ink-jet process. Accordingly, a pre-baking process performed at a high temperature, or a developing process exposed by a developing solution, and a subsequently performed post-bake process may be omitted.

In the case of a post baking process of the photolithography process, the display substrate is exposed at a high temperature of about 220 degrees (° C.) or higher for about tens of minutes. Alternatively, because the method of manufacturing a display device according to an embodiment of the present invention does not require other high temperature processes, except for the curing process of about 100 degrees (° C.) or below, damage to an organic layer by the high temperature can be reduced or prevented.

In addition, because the method of manufacturing a display device according to an embodiment of the present invention does not further require either an additional developing process for forming color patterns, or a thermal curing process including soft baking or hard baking performed before the development process, process time and cost may be saved. In addition, because only one photolithography process is performed for forming a black matrix, damage to the display substrate DP otherwise caused by a plurality of photolithography processes may be reduced. As a result, reliability is improved.

Additionally, the color pattern CP of other embodiments may be formed by a staining method that is different from a photolithography process, or may be formed by an electrical deposition.

Figure 8H:
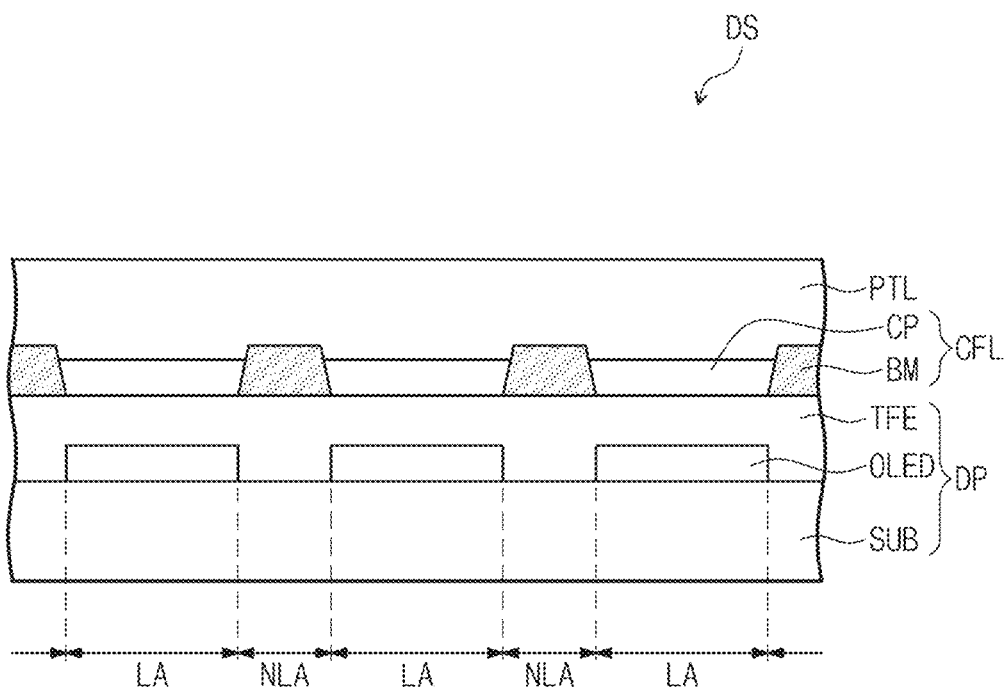

As illustrated in FIG. 8H, a protective layer PTL is formed on the color filter layer CFL. The protective layer PTL is formed by depositing an insulating material on the color filter layer CFL. The protective layer PTL may have a set or predetermined thickness so as to cover a non-uniform upper surface formed on the color filter layer CFL and to provide a uniform flat surface.

According to the above description, in a method of manufacturing a display device according to an embodiment of the present invention, a black matrix and a color pattern are formed through different processes. The black matrix may be formed by a photolithography process, and the color pattern may be formed by an ink-jet process. Accordingly, a plurality of photolithography processes may be omitted, so that process time and cost are saved, and so that damage to the display substrate due to the photolithography process may be reduced or prevented.

In addition, a display device according to the present invention includes a black matrix and a color filter layer including a color pattern that is thinner than the black matrix. The color filter layer is directly formed on the display substrate. Therefore, the display device becomes thinner and may obtain flexibility, which is useful for a foldable display device.

The above-disclosed subject matter is to be considered illustrative and not restrictive, and the appended claims and their equivalents are intended to cover all such modifications, enhancements, and other embodiments, which fall within the spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A display device comprising:
 a display substrate comprising a base substrate comprising a plurality of emission regions and a non-emission region adjacent the plurality of emission regions, a pixel on the base substrate, and an encapsulation layer over the base substrate and covering the pixel;
 a barrier on the display substrate and defining a plurality of openings respectively overlapping the plurality of emission regions; and
 a plurality of color patterns respectively filled in the plurality of openings, and
 a protective layer on the barrier and the plurality of color patterns,
 wherein the barrier is in direct contact with the encapsulation layer,
 wherein a distance from the base substrate to an upper surface of the barrier is greater than a distance from the base substrate to an upper surface of the plurality of color patterns, and
 wherein the distance from the base substrate to the upper surface of the barrier is greater than a distance from the base substrate to a lowermost surface of a portion of the protective layer.

2. The display device of claim 1, wherein the encapsulation layer comprises inorganic layers, and an organic layer located between the inorganic layers, and
 wherein the barrier is in direct contact with an uppermost inorganic layer among the inorganic layers.

3. The display device of claim 1, wherein a range of a thickness of the encapsulation layer is from about 1 µm to about 10 µm.

4. The display device of claim 1, wherein the protective layer has a flat surface.

5. The display device of claim 1, wherein each of the plurality of color patterns is thinner than a respective adjacent portion of the barrier.

6. The display device of claim 1, wherein the pixel comprises:
 a transistor disposed on the base substrate;
 an anode electrode connected to the transistor;
 a cathode electrode disposed on the anode electrode; and
 an emission pattern disposed between the anode electrode and cathode electrode and overlapping a corresponding emission region among the plurality of emission regions.

7. The display device of claim 1, wherein the plurality of color patterns are directly connected with an upper surface of the encapsulation layer.

8. The display device of claim 1, wherein the barrier has a grid shape in a plan view.

9. The display device of claim 1, wherein the barrier comprises a black matrix containing light-blocking material.

10. The display device of claim 1, wherein the plurality of color patterns are in direct contact with a side of the barrier defining the plurality of openings, and with a top of the encapsulation layer.

11. The display device of claim 1, wherein a thickness of the barrier on the encapsulation layer is greater than a thickness of the plurality of color patterns.

* * * * *